(12) United States Patent
Chen et al.

(10) Patent No.: US 6,749,684 B1
(45) Date of Patent: Jun. 15, 2004

(54) METHOD FOR IMPROVING CVD FILM QUALITY UTILIZING POLYSILICON GETTERER

(75) Inventors: Huajie Chen, Wappingers Falls, NY (US); Dan Mocuta, LaGrangeville, NY (US); Richard J. Murphy, Clinton Corners, NY (US); Paul Ronsheim, Hopewell Junction, NY (US); David Rockwell, Susquehanna, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/250,181

(22) Filed: Jun. 10, 2003

(51) Int. Cl.⁷ .............................................. C30B 25/04
(52) U.S. Cl. ............................ 117/20; 117/2; 117/19; 423/328.2; 427/248.1; 427/251
(58) Field of Search ................................ 117/2, 19, 20; 423/328.2; 427/248.1

(56) References Cited

U.S. PATENT DOCUMENTS

| | | |
|---|---|---|
| 4,053,335 A | 10/1977 | Hu |
| 5,134,301 A | 7/1992 | Kamata et al. |
| 5,374,842 A | 12/1994 | Kusakabe |
| 5,993,594 A | 11/1999 | Wicker et al. |
| 6,120,660 A | 9/2000 | Chu et al. |
| 6,217,724 B1 | 4/2001 | Chu et al. |
| 6,374,871 B2 | 4/2002 | Donohoe |

*Primary Examiner*—Felisa Hiteshew
(74) *Attorney, Agent, or Firm*—Margaret A. Pepper

(57) ABSTRACT

A method is disclosed for forming an epitaxial layer on a front side of a substrate formed of a monocrystalline material, using a chemical vapor deposition system. In this method, a plurality of gettering wafers formed of a gettering material are arranged in the CVD system, such that the front side of each substrate is facing one of the gettering wafers. Impurities present in the CVD system during formation of the epitaxial layer are gettered by the gettering wafers. Alternatively, a layer of a gettering material is deposited on a back side of each of the plurality of substrates, and the substrates are arranged such that the front side of each substrate is facing the backside of another of the substrates. In another embodiment, a layer of a gettering material is deposited on an interior surface of the CVD system. Impurities removed from the CVD system during epitaxial formation include oxygen, water vapor and other oxygen-containing contaminants.

19 Claims, 1 Drawing Sheet

METHOD FOR IMPROVING CVD FILM QUALITY UTILIZING POLYSILICON GETTERER

BACKGROUND OF INVENTION

This invention relates generally to the manufacture of integrated circuit devices, and more specifically, to the deposition of epitaxial films by chemical vapor deposition.

In a chemical vapor deposition (CVD) system, source gases such as $SiH_4$ and $GeH_4$ are injected into a chamber and react on heated wafer surface, thereby depositing or growing a film on top of the wafer. When a single-crystal film is deposited or grown on a single-crystal substrate, the crystal growth is called epitaxy. For high quality epitaxial film growth, it is important to use a system with a high purity environment, i.e., with ultra-low background of impurities such as $H_2O$, $O_2$, and other oxygen-containing species. If the system used does not achieve this high purity condition, the film grown will have poor quality. Specifically, it has been found that epitaxial films grown in an environment containing the above-mentioned impurities often exhibit a rough surface or have a high density of pits.

CVD chambers often are not able to achieve this requirement of ultra low impurity level, either because of limitations of the system or contamination of the chamber or process gases. Bringing the system to ideal high-purity conditions typically requires changing the deposition tube, a thorough bake out, or purchase of a new system. All of these options are time consuming and costly.

Various approaches to prevent or remove contamination have been attempted. In one approach, a film or coating is applied to prevent particles or impurities from being sputtered off from a member in the reaction chamber. For example, U.S. Pat. No. 6,374,871 to Donohoe discloses a removable container which is inserted into a processing chamber and in which the work piece processing is carried out. The container includes one or more ports located in the side and connecting with ports of the processing chamber which provide gases or other materials used in processing. Donohoe teaches that the use of such container prevents particles releasing from the process chamber, and reduces the need to periodically clean processing chambers. However, such container does not address the problem of the molecular contamination such as $H_2O$, $O_2$ and other oxygen-containing species present in the chamber or introduced by source gases.

In another example, U.S. Pat. Nos. 6,120,660 and 6,217,724 to Chu et al disclose the use of a silicon coating on the wafer susceptor or as a liner on the chamber walls in a plasma immersion ion implantation treatment system, and U.S. Pat. No. 5,134,301 to Kamata et al. disclose a silicon coating on ion implanting apparatus such as an electrode. Such coatings protect the wafer from impurities dislodged from the susceptor, chamber walls or electrode during processing. However, these coatings do not address the problem of the molecular contamination such as $H_2O$, $O_2$ and other oxygen-containing species present in the chamber or introduced by source gases.

Another approach involves the use of a coating of polycrystalline silicon, or polysilicon, on the wafer itself. Such polysilicon coatings act as gettering members to remove contaminants after they are already present in the substrate. For example, U.S. Pat. No. 5,374,842 to Kusakabe discloses the use of a polysilicon coating at the backside of the wafer to getter metals entering the wafer front surface during processing, thereby removing metals from the active device area so that device performance will not be impacted. In another example, U.S. Pat. No. 4,053,335 to Hu discloses a backside layer of polysilicon for gettering of unwanted impurities from the integrated circuits. However, such polysilicon gettering of contaminants after they are already present in the substrate does not solve the problem of contaminants in the processing chamber adversely affecting the quality of epitaxial film growth, especially in a CVD system.

Thus, there remains a need in the art for a method of achieving a high-purity environment and preventing contaminants in the CVD processing chamber from reaching the wafer surface during epitaxial silicon growth.

SUMMARY OF INVENTION

It is therefore an object of this invention to provide an improved method for forming an epitaxial layer on a monocrystalline substrate. In one aspect of the invention, a method is disclosed for forming an epitaxial layer on a front side of each of a plurality of substrates, the front side being formed of a monocrystalline material. The method comprises the steps of: providing a plurality of gettering wafers formed of a gettering material; arranging the plurality of substrates and plurality of gettering wafers in a chemical vapor deposition system, such that the front side of each substrate is facing one of the plurality of gettering wafers; and forming the epitaxial layer by chemical vapor deposition. Impurities present in the chemical vapor deposition system during formation of the epitaxial layer are gettered by the gettering wafers.

In another aspect of the invention, a method is disclosed for forming an epitaxial layer on a front side of each of a plurality of substrates, the front side being formed of a monocrystalline material and a back side of each of the plurality of substrates comprising a layer of a gettering material. The method comprises the steps of: arranging the plurality of substrates in a chemical vapor deposition system, such that the front side of each substrate is facing the back side of another of the substrates; and forming the epitaxial layer by chemical vapor deposition. Again, impurities present in the chemical vapor deposition system during epitaxial formation are gettered by the layer of gettering material.

In yet another aspect of the invention, a method is disclosed for forming an epitaxial layer on a front side of a substrate, the front side being formed of a monocrystalline material. The method comprises the steps of: depositing a layer of a gettering material on an interior surface of a chemical vapor deposition system; and forming the epitaxial layer by chemical vapor deposition. Again, impurities present in the chemical vapor deposition system during epitaxial formation are gettered by the layer of gettering material.

BRIEF DESCRIPTION OF DRAWINGS

The features of the invention believed to be novel and the elements characteristic of the invention are set forth with particularity in the appended claims. The drawing is for illustration purposes only and is not drawn to scale. Furthermore, like numbers represent like features in the drawing. The invention itself, however, both as to organization and method of operation, may best be understood by reference to the detailed description which follows, taken in conjunction with the accompanying drawing, in which:

DETAILED DESCRIPTION

Figure 1:
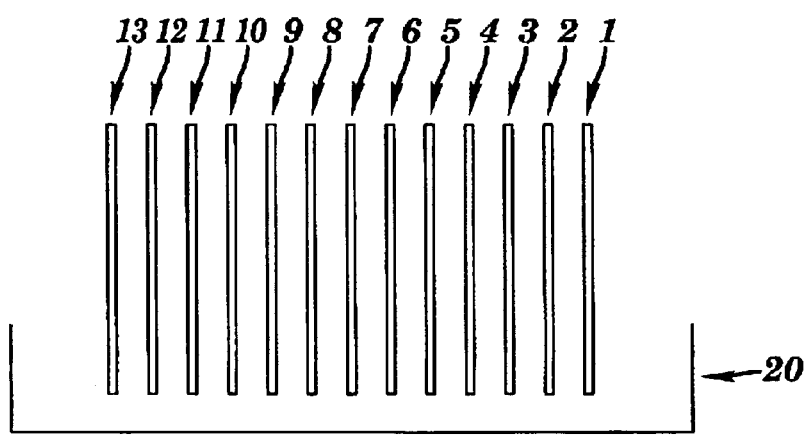
FIG. 1 shows a wafer carrier or boat containing wafers for use in the method of this invention.

The invention will now be described by reference to the accompanying figure. In the figure, various aspects of the invention have been shown and schematically represented in a simplified manner to more clearly describe and illustrate the invention. For example, the figure is not intended to be to scale. Moreover, the invention is not limited to constructions of any particular shape.

This invention involves a process that uses a gettering material such as polysilicon to getter impurity species and improve CVD film quality, enabling the growth of high quality films in a non-ideal system without time consuming and costly system modification, or enabling further improvement of film quality in a good system.

In a batch CVD tool, multiple wafers are typically stacked either horizontally or vertically. In this invention, wafers formed of a gettering material such as polysilicon are placed in front of each single crystal wafer, so that the surface on which the epitaxial film is to be grown is facing a polysilicon surface. The epitaxial film surface morphology is significantly improved with this invention, and high quality films can be grown in a system with non-ideal impurity level.

The substrate on which the epitaxial layer is to be formed, i.e., the epitaxy substrate, has a front side formed of a monocrystalline material such as silicon or silicon germanium. Such substrates may include, for example, single crystal wafers or silicon-on-insulator (SOI) substrates.

The epitaxial layer may be formed of silicon or silicon germanium, or a multi-layer structure formed of silicon and silicon germanium.

FIG. 1 shows a typical wafer carrier or boat 20, containing 13 wafer slots. Wafers formed of a gettering material such as polysilicon may be placed in slots 1, 3, 5, 7, 9, 11 and 13, and the substrates on which the epitaxial film is to be grown may be placed in slots 2, 4, 6, 8, 10 and 12.

Alternatively, the backside of epitaxy substrates may be coated with a polysilicon film, eliminating the need for separate polysilicon filler wafers. In this alternative embodiment, the front surface of a substrate will face the polysilicon film at the backside of the next substrate. For the very front substrate, a polysilicon filler wafer may be placed at the front position of the batch. For example, in the wafer boat shown in FIG. 1, an epitaxy substrate having a backside coating of polysilicon or other gettering material may be placed in slot 2, with the backside coating facing slot 3. A similar substrate is placed in slot 3, with the front surface facing the backside coating of the substrate in slot 2. The substrate in slot 3 also has a backside coating of gettering material, which faces the front surface of the next substrate in slot 4. Similar substrates having backside coatings are placed in each of slots 2–13, and a wafer formed of gettering material such as polysilicon may be placed in the front slot 1.

As the gettering material, polysilicon is preferred, but other materials exhibiting similar gettering properties such as polycrystalline silicon germanium also may be used.

In a single wafer tool, this invention can be adapted to have the advantage of the gettering property of the film of gettering material. For example, an interior surface of the CVD system, such as the chamber wall and susceptor, may be coated with a film of polysilicon or polycrystalline silicon germanium, before the epitaxial substrate is loaded into the chamber and the epitaxial film is grown.

Example: In a wafer carrier or boat similar to that shown in FIG. 1, polysilicon wafers were placed in slots 4 and 6. In the remaining slots were placed wafers having a monocrystalline surface on which an epitaxial film was to be grown. A UHV-CVD (ultra high vacuum chemical vapor deposition) system was used to form the epitaxial films. $SiH_4$ and $GeH_4$ were used as source gases for Si and SiGe epitaxy. The epitaxy was done at a pressure of 1–10 mTorr, and a temperature of 500–550C. Following epitaxy formation, wafers placed in slots 1–3 and 8–13 exhibited pits with density on the order of $1 \times 10^6/cm^2$ on the epitaxial film. Wafers placed in slots 5 and 7 faced the polysilicon wafers in slots 4 and 6. The epitaxial film grown on these wafers in slots 5 and 7 had a smooth surface without pits.

Although the above example was performed in a UHV-CVD system using the source gases and operating conditions specified, this invention is not limited to this narrow operating condition. This invention may be used for UHV-CVD, LPCVD (low pressure chemical vapor deposition), RPCVD (reduced pressure chemical vapor deposition) or APCVD (atmospheric pressure chemical vapor deposition) systems, with any suitable growth pressure and temperature. For example, a growth pressure of about 0.1 mTorr up to atmospheric pressure, and a temperature of 400 to 1200C., may be used. Typical source gases for Si include $SiH_4$, $SiH_2Cl_2$, $Si_2H_6$, $SiHCl_3$, $SiCl_4$, and a typical source gas for Ge is $GeH_4$, but the choice of the type of source gas is not critical in invention and is not limited to the above mentioned gases.

While the present invention has been particularly described in conjunction with a specific preferred embodiment and other alternative embodiments, it is evident that numerous alternatives, modifications and variation will be apparent to those skilled in the art in light of the foregoing description. It is therefore intended that the appended claims embrace all such alternatives, modifications and variations as falling within the scope and spirit of the present invention.

What is claimed is:

1. A method for forming an epitaxial layer on a front side of each of a plurality of substrates, the front side being formed of a monocrystalline material, the method comprising the steps of:

providing a plurality of gettering wafers formed of a gettering material;

arranging the plurality of substrates and plurality of gettering wafers in a chemical vapor deposition system, such that the front side of each substrate is facing one of the plurality of gettering wafers; and forming the epitaxial layer by chemical vapor deposition.

2. The method of claim 1, wherein impurities present in the chemical vapor deposition system during the formation are gettered by the gettering wafers.

3. The method of claim 2, wherein the impurities are selected from the group consisting of oxygen, water vapor and other oxygen-containing contaminants.

4. The method of claim 1, wherein the gettering material is polysilicon.

5. The method of claim 1, wherein the gettering material is polycrystalline silicon germanium.

6. The method of claim 1, wherein the monocrystalline material is silicon or silicon germanium, and the epitaxial layer is formed of silicon or silicon germanium.

7. The method of claim 5, wherein the plurality of substrates comprise silicon-on-insulator substrates with the front side being formed of monocrystalline silicon.

8. A method for forming an epitaxial layer on a front side of each of a plurality of substrates, the front side being formed of a monocrystalline material and a back side of each of the plurality of substrates comprising a layer of a gettering material, the method comprising the steps of:

arranging the plurality of substrates in a chemical vapor deposition system, such that the front side of each substrate is facing the back side of another of the substrates; and forming the epitaxial layer by chemical vapor deposition, wherein impurities present in the chemical vapor deposition system during the formation are gettered by the layer of gettering material.

9. The method of claim 8, wherein the gettering material is polysilicon.

10. The method of claim 8, wherein the gettering material is polycrystalline silicon germanium.

11. The method of claim 8, wherein the monocrystalline material is silicon and the epitaxial layer is formed of silicon or silicon germanium.

12. The method of claim 11, wherein the plurality of substrates comprise silicon-on-insulator substrates with the front side being formed of monocrystalline silicon.

13. The method of claim 8, wherein the impurities are selected from the group consisting of oxygen, water vapor and other oxygen-containing contaminants.

14. A method for forming an epitaxial layer on a front side of a substrate, the front side being formed of a monocrystalline material, the method comprising the steps of:

depositing a layer of a gettering material on an interior surface of a chemical vapor deposition system; and forming the epitaxial layer by chemical vapor deposition, wherein impurities present in the chemical vapor deposition system during the formation are gettered by the layer of gettering material.

15. The method of claim 14, wherein the gettering material is polysilicon.

16. The method of claim 14, wherein the gettering material is polycrystalline silicon germanium.

17. The method of claim 14, wherein the monocrystalline material is silicon and the epitaxial layer is formed of silicon or silicon germanium.

18. The method of claim 17, wherein the substrate is a silicon-on- insulatorsubstrate with the front side being formed of monocrystalline silicon.

19. The method of claim 14, wherein the impurities are selected from the group consisting of oxygen, water vapor and other oxygen-containing contaminants.

* * * * *